US006797876B2

(12) United States Patent
Matsudate et al.

(10) Patent No.: US 6,797,876 B2
(45) Date of Patent: Sep. 28, 2004

(54) IMAGE DISPLAY DEVICE

(75) Inventors: Noriharu Matsudate, Kujukuri (JP); Atsuo Nakagawa, Mobara (JP)

(73) Assignee: Hitachi, Ltd., Tokyo (JP)

(*) Notice: Subject to any disclaimer, the term of this patent is extended or adjusted under 35 U.S.C. 154(b) by 98 days.

(21) Appl. No.: 10/093,570

(22) Filed: Mar. 8, 2002

(65) Prior Publication Data

US 2002/0129952 A1 Sep. 19, 2002

(30) Foreign Application Priority Data

Mar. 14, 2001 (JP) ....................................... 2001-072063

(51) Int. Cl.$^{7}$ .................................................. H05K 9/00

(52) U.S. Cl. ................................ 174/35 MS; 348/819; 348/820; 313/313; 313/479

(58) Field of Search ................................ 348/818, 819, 348/820; 174/35 R, 35 MS; 313/313, 479

(56) References Cited

U.S. PATENT DOCUMENTS 4,701,801 A * 10/1987 Hobbins et al. ............ 348/819
5,757,117 A * 5/1998 Hirasawa et al. ........... 313/479
2002/0041343 A1 * 4/2002 Ikui et al. ................... 348/819

FOREIGN PATENT DOCUMENTS

| | | |
|---|---|---|
| JP | 63-043246 | 2/1988 |
| JP | 03-062434 | 3/1991 |
| JP | 05-05-4833 | 3/1993 |
| JP | 05-190117 | 7/1993 |
| JP | 08-087970 | 4/1996 |
| JP | 09-129159 | 5/1997 |
| JP | 10-144239 | 5/1998 |
| JP | 10-214579 | 8/1998 |
| JP | 2000-200569 | 7/2000 |

* cited by examiner

*Primary Examiner*—Hung V. Ngo
(74) *Attorney, Agent, or Firm*—Milbank, Tweed, Hadley & McCloy LLP

(57) ABSTRACT

There is provided an image display device including a panel of good work efficiency which can prevent the destruction of its conductive coat due to discharge and can highly efficiently reduce the leakage of unwanted radiation electric fields. The image display device includes a panel grounding electrode which connects a conductive coat and a grounding member together, and the panel grounding electrode uses a conductive adhesive material having in the whole of an adhesive layer, and an insulative protective tape.

4 Claims, 4 Drawing Sheets

IMAGE DISPLAY DEVICE

BACKGROUND OF THE INVENTION

The present invention relates to a panel grounding electrode and a display device, and more particularly, to a grounding electrode for providing electrical connection between a conductive coat and a grounding member such as a reinforcing band or a frame, the conductive coat having a low-reflection antistatic function or an unwanted radiation electric field leakage preventing function and being formed on a surface of a display area of a panel which constitutes an image display device such as a color cathode ray tube or a liquid crystal display panel, as well as to a display device which has an antistatic function or an unwanted radiation electric field leakage preventing function using such a grounding electrode.

There are image display devices such as various kinds of cathode ray tubes including color cathode ray tubes and flat panel displays including liquid crystal panels and cold cathode panels. Such an image display device has a conductive coat coated on at least the surface of its display area which constitutes its screen, for the purpose of preventing electrical-shock accidents or attraction of dust to its surface from being caused by static electricity which occurs on its display surface, or for the purpose of preventing an unwanted radiation electric field from leaking to the outside.

This conducive coat ordinarily has a low-reflection layer on its outermost surface and is also called a low-reflection antistatic film. The conductive coat prevents reflection of external light on the panel, and is electrically connected to grounding members of the device so that static electricity occurring due to the operation of the device is not accumulated in the conductive coat.

For example, a color cathode ray tube includes a vacuum envelope (glass bulb) which is made of a panel having phosphors, a neck which houses an electron gun, and a funnel which connects the panel and the neck, and provides image display by causing electron beams to scan the phosphor film applied to the inner surface of the panel. In the color cathode ray tube, a high-voltage anode voltage is applied to the phosphor film. For this reason, static electricity is induced on the surface of the panel and is accumulated at a high potential, and this static electricity gives adverse influences such as giving an electric shock to a user and attracting surrounding dust to degrade the quality of display images. In addition, there is a likelihood that the low-reflection antistatic film may be destroyed by a high-voltage electric field (unwanted radiation electric field) radiated during the operation of the display device or by discharge accompanying the on/off operation of its power source.

For this reason, the conductive coat is coated onto the surface of the panel, and is electrically connected to a reinforcing band which is a grounding member held at ground potential, by using a conductive member such as metal tape or conductive rubber.

Similarly, in a flat panel display such as a liquid crystal panel, a conductive coat coated on its panel is electrically connected to a frame positioned at the periphery of its display area, by using a conductive member similar to the aforementioned one.

The manner of conductive connection between the panel and the grounding member will be described below with reference to a color cathode ray tube by way of example.

FIG. 7 is a schematic view of the front of a panel portion of a color cathode ray tube, aiding in explaining the essential construction of the color cathode ray tube whose panel has a surface coated with a conductive coat, while FIG. 8 is a schematic side view of the entire color cathode ray tube.

In FIGS. 7 and 8, reference numeral 1 denotes a panel which forms a screen serving as a display area, and the panel 1 has a surface coated with an antireflection film as well as a conductive coat 2 for preventing static charging and for preventing an unwanted radiation electrical field. Reference numeral 60 denotes a grounding tape (metal tape) made of a metal foil which serves as a grounding electrode. Reference numeral 4 denotes a reinforcing band for preventing implosion, which is tightly wrapped around the vicinity of a portion in which the panel 1 and a funnel are sealed together. Reference numeral 10 denotes a mounting support (lug or bracket) which is provided at each required position on the reinforcing band 4. Reference numeral 11 denotes a neck which houses an electron gun. Reference numeral 12 denotes a funnel portion which connects the panel 1 and the neck 11.

The surface of the panel 1 is coated with the conductive coat 2 made of a transparent conductive material, and the grounding tape (metal tape) 60 is stuck to both the conductive coat 2 and the reinforcing band 4 so that the conductive coat 2 is electrically connected and grounded to the reinforcing band 4 (for example, Japanese Patent Laid-Open No. 174945/1992).

The conductive coat 2 has a surface resistance of approximately 10–100 kΩ/□ so that unwanted radiation electric fields leaking from the panel 1 can be reduced. For this reason, in the related art, in the case where the grounding tape 60 made of a metal foil is used as a grounding electrode, a discharge phenomenon occurs at the interface between the conductive coat 2 and the grounding tape 60 and the destruction of the conductive coat gradually proceeds, so that the reliability of electrical conduction is impaired.

Accordingly, to inhibit the destruction of the conductive coat, the conductive coat and the reinforcing band are connected together by a silicone resin which contains a conductive filler, instead of by the metal-foil grounding tape (Japanese Patent Laid-Open No. 83434/1990), or the conductive coat is subjected to ultrasonic soldering and the obtained solder portion and the reinforcing band are connected together by a conductive material such as metallic wire (Japanese Patent Laid-Open No. 286229/1989).

SUMMARY OF THE INVENTION

As described above, the construction in which the metal-foil grounding tape is used to provide connection between the conductive coat and the reinforcing band can realize a high work efficiency during its manufacturing process. However, in the case where the conductive coat has a multi-layer structure in which its outermost layer is an insulator, its electrical conduction becomes unstable. In the case of a conductive coat having a surface resistance of 100 kΩ/□ or less, the destruction of the conductive coat due to discharge occurs.

In the case where the silicone resin (conductive silicone) which contains a conductive filler is used to connect the conductive coat and the reinforcing band, the destruction of the conductive coat due to discharge can be inhibited so that electrical conduction can be effectively ensured. However, the conductive silicone has the problems that its curing time after application is long and its handling until curing is not easy, and that its adhesion to the conductive coat after curing is good but the conductive silicone is difficult to remove during a recycle process and is inferior in work efficiency.

Furthermore, in the case of silicone having a high resistivity, in an antistatic film which includes a conductive coat having a surface resistance of several hundred Ω/□ and is provided with a low-reflection function, it is impossible to fully utilize the low-resistance characteristic of the conductive coat, so that it is impossible to reduce leakage unwanted radiation electric fields which are minute alternating potentials.

Even in the method of subjecting the conductive coat to ultrasonic soldering and connecting the obtained solder portion and the reinforcing band together by a conductive material such as metal-foil grounding tape, if the surface resistance of the conductive coat is several hundred Ω/□, the destruction of the conductive coat due to discharge occurs, and the conductive silicone is difficult to remove even during a recycle process.

Incidentally, the above description is not limited to color cathode ray tubes and similarly applies in various kinds of displays such as liquid crystal panels.

Other documents which disclose related arts associated with the above-described ones are Japanese Patent Laid-Open Nos. 149108/1998, 129159/1997, 214579/1998, 233180/1998 and 82434/1990.

A representative object of the invention is to provide a panel grounding electrode which prevents the destruction of its conductive coat due to discharge and highly efficiently reduces the leakage of unwanted radiation electric fields, and which is high in the work efficiency with which the conductive coat and a grounding member are electrically connected together, as well as to provide an image display device which includes the panel grounding electrode.

To achieve the above object, the invention uses a conductive adhesive material having conductivity in the whole of an adhesive layer, as means (panel grounding electrode) for providing connection between the conductive coat and the grounding member. Representative aspects of the invention will be described below.

First, regarding a panel grounding electrode which provides connection between a conductive coat and a grounding member, (1) the grounding member is disposed outside a display area of a panel having a conductive layer on its surface and an insulating layer on the conductive layer, and the panel grounding electrode for electrically connecting the conductive layer and the grounding member in a peripheral portion of the display area includes a conductive adhesive material having conductive in the whole of an adhesive layer. The conductive adhesive material having conductivity in the whole of the adhesive layer makes use of conductivity based on a so-called π electron conduction theory.

(2) In Paragraph (1), an adhesive insulating protective tape is provided on the surface of the conductive adhesive material opposite to a surface thereof which adheres to the panel.

(3) In Paragraph (2), a metal-evaporated tape is provided between the conductive adhesive material and the insulating protective tape.

(4) In Paragraphs (1) to (3), the conductive adhesive material uses a silicone-based adhesive material into which is kneaded a silicone-based resin in which carbon particulates are dispersed.

(5) In Paragraphs (1) to (3), the conductive adhesive material uses an acrylic-based adhesive material into which is kneaded a silicone-based resin in which carbon particulates are dispersed.

According to the above-described construction, it is possible to provide a grounding electrode which ensures a good work efficiency and a stable electrical conduction. In addition, regarding an image display device using the above-described panel grounding electrode, (6) the image display device includes a grounding member disposed outside a display area of a panel coated with a conductive coat, and a panel grounding electrode for electrically connecting the conductive coat to the grounding member in a peripheral portion of the display area, and the panel grounding electrode includes a conductive adhesive material.

(7) In Paragraph (6), the panel grounding electrode has an adhesive insulating protective tape on the surface of the conductive adhesive material opposite to a surface thereof which adheres to the panel, and at least part of the insulative protective tape is adhered to either one or both of the panel and the grounding member beyond the conductive adhesive material.

(8) In Paragraph (7), a metal-evaporated tape is provided between the conductive adhesive material and the insulating protective tape.

According to the above-described constructions, it is possible to provide an image display device provided with an antistatic function or an unwanted radiation electric field leakage preventing function.

The invention is not limited to any of the above-described constructions nor any of the constructions of embodiments which will be described later, and it goes without saying that various modifications can be made without departing from the technical ideas of the invention.

BRIEF DESCRIPTION OF THE DRAWINGS

The invention will become more readily appreciated and understood from the following detailed description of preferred embodiments of the invention when taken in conjunction with the accompanying drawings, in which.

DESCRIPTION OF THE PREFERRED EMBODIMENTS

Preferred embodiments of the invention will be described below in detail with reference to examples of a color cathode ray tube to which the invention is applied.

Figure 1:
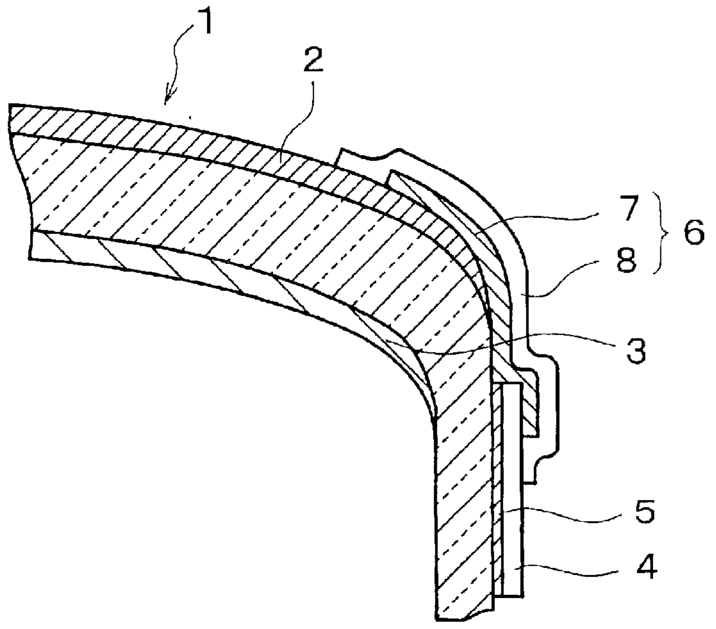
FIG. 1 is a cross-sectional view schematically illustrating the essential structure of a first embodiment of a color cathode ray tube according to the invention.

FIG. 1 is a cross-sectional view schematically illustrating the essential structure of a first embodiment of a color cathode ray tube according to the invention. Reference numeral 1 denotes a panel of the color cathode ray tube, and a conductive coat 2 is formed on a surface of the panel 1. This conductive coat 2 is made of a multi-layer film having two or more layers. In this multi-layer film, a layer which is in contact with the panel 1 is an antistatic layer (conductive layer) containing metal particles or metal oxide particles. The outermost surface of the conductive coat 2 has an antireflection layer made of silica particles or a multi-layer interference film. The antireflection film on the outermost surface is an insulating layer whose index of refraction for light is low compared to the conductive layer and does not contain a conductive material such as metal particles or metal oxide particles. Reflection of external light on the screen of the color cathode ray tube is inhibited by the difference in index of refraction between the conductive layer and the insulating layer.

The inside of the panel 1 is coated with a phosphor layer 3, and a reinforcing band 4 which serves as a grounding member for the conductive coat 2 is provided in the state of being wrapped around a skirt portion which constitutes the periphery of the panel 1. This reinforcing band 4 is formed of an iron material, and is tightly fitted with a reinforcing tape 5 interposed between the reinforcing band 4 and the exterior of the panel 1.

This conductive coat 2 is electrically connected and grounded to the reinforcing band 4 which serves as a grounding member, by a grounding electrode 6. The location at which to adhere the grounding electrode 6 may be each corner of the panel 1 or each of two opposite sides or four sides of the panel 1, or a plurality of grounding electrodes 6 may be adhered to each side of the panel 1 at different locations thereof. The grounding electrode 6 includes a conductive adhesive material 7 and an insulating protective tape 8 stacked on the back of the conductive adhesive material 7 (the surface of the conductive adhesive material 7 opposite to the exterior of the panel 1).

Figure 2A:
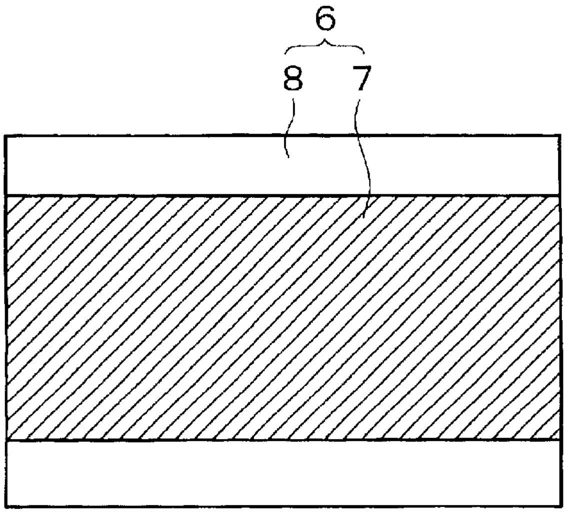
FIGS. 2A, 2B and 2C are explanatory views of the grounding electrode shown in FIG. 1.
Figure 2C:
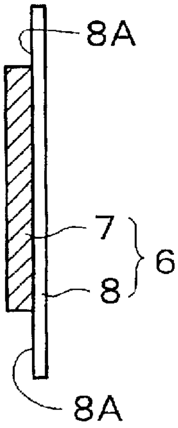
Figure 2B:
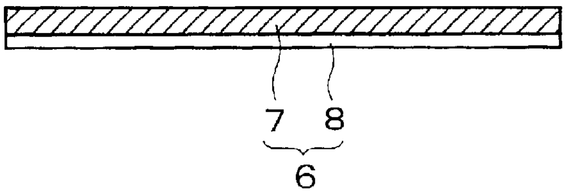

FIGS. 2A, 2B and 2C are explanatory views of the grounding electrode 6 shown in FIG. 1, and FIG. 2A is a plan view, FIG. 2B is a side view taken in a direction along its longer sides, and FIG. 2C is a side view taken in a direction along its shorter sides. It is possible to obtain a sufficient grounding effect by using only the conductive adhesive material 7 to bridge the conductive coat 2 of the panel 1 and the reinforcing band 4 which serves as a grounding member.

However, the conductive adhesive material 7 itself has conductivity and tackiness as a whole owing to a π electron effect, and it is desirable to avoid the likelihood that electrical-shock accidents or troubles may be caused during handling owing to the exposure of the adhesive surface of the back of the conductive adhesive material 7.

For this reason, the conductive adhesive material 7 is covered with the insulating protective tape 8. The insulating protective tape 8 may be a resin sheet such as a PET sheet coated with an adhesive agent, and has the function of providing electrical insulation from the outside and preventing adhesion of dust by covering the back of the conductive adhesive material 7 having tackiness.

Incidentally, according to experiments by the present inventors, the π electron effect is assumed to be an effect which enables electrical conduction in an insulating layer made of $SiO_2$ or the like formed on a conductive layer. Owing to the π electron effect, by providing the conductive adhesive material 7 on the insulating layer that has been considered to be originally non-conducting, it is possible to realize electrical conduction to the conductive layer formed under the insulating layer.

When the thickness of the insulating layer is 100 nm, electrical conduction can be obtained with respect to a resistance of 400 $\Omega/cm^2$ or less.

The conductive adhesive material 7 is prepared by forming a silicone- or acrylic-based adhesive material in which carbon particulates are dispersed, into a tape- or sheet-like shape. The size of the conductive adhesive material 7 may be appropriately selected according to the panel size of a cathode ray tube to which to apply the conductive adhesive material 7 as well as the number of conductive adhesive materials 7 to be used.

In the grounding electrode 6 of the first embodiment, the insulating protective tape 8 extends beyond the opposite ends of the conductive adhesive material 7 in a direction along its shorter sides, and adheres to both the conductive coat 2 of the panel 1 and the reinforcing band 4 which serves as a grounding member, thereby firmly adhering the grounding electrode 6 to the conductive coat 2 in combination with the tackiness of the conductive adhesive material 7. Incidentally, the direction along the shorter sides is a direction which extends from the conductive coat 2 to the reinforcing band 4 as viewed in FIG. 1.

According to the first embodiment, it is possible to provide a grounding electrode which ensures a good work efficiency and a stable electrical conduction.

Figure 3:
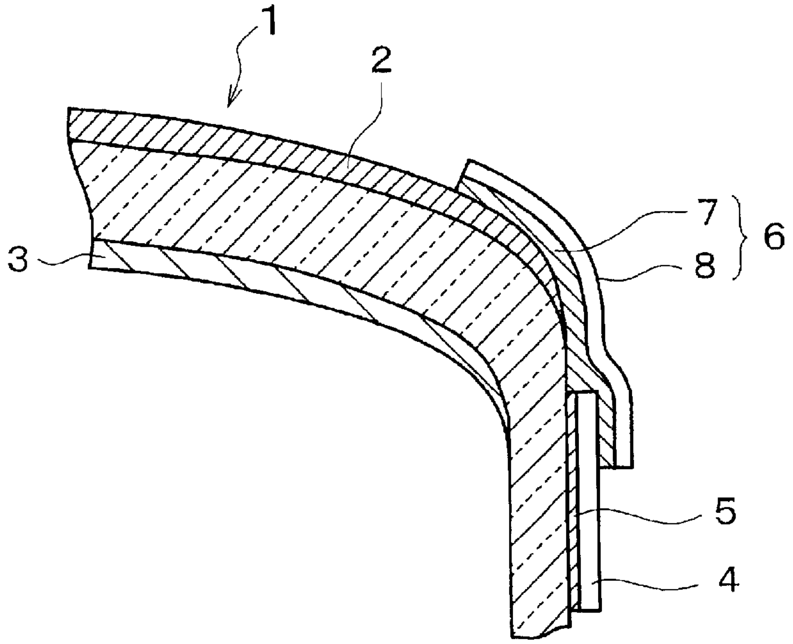
FIG. 3 is a cross-sectional view schematically illustrating the essential structure of a second embodiment of a color cathode ray tube according to the invention.
Figure 4A:
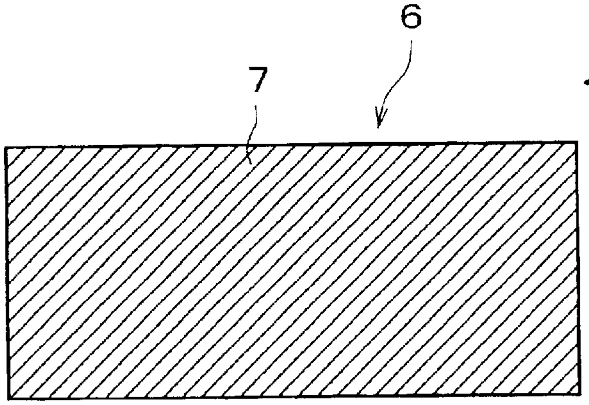
FIGS. 4A, 4B and 4C are explanatory views of the grounding electrode shown in FIG. 3.
Figure 4C:
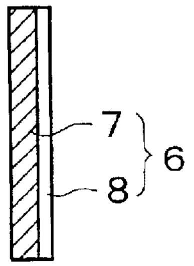
Figure 4B:
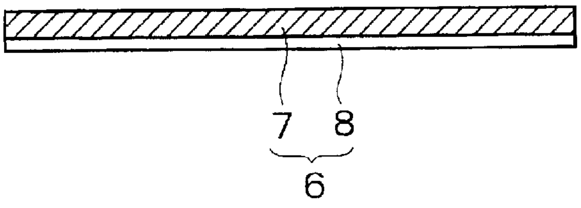

FIG. 3 is a cross-sectional view schematically illustrating the essential structure of a second embodiment of a color cathode ray tube according to the invention. FIGS. 4A, 4B and 4C are explanatory views of the grounding electrode 6 shown in FIG. 3, and FIG. 4A is a plan view, FIG. 4B is a side view taken in a direction along its longer sides, and FIG. 4C is a side view taken in a direction along its shorter sides. In FIGS. 3 to 4C, the same reference numerals as those used in FIGS. 1 to 2C correspond to the same functional portions shown in FIGS. 1 to 2C. Incidentally, the direction along the short sides of the grounding electrode 6 is a direction which extends from the conductive coat 2 to the reinforcing band 4 as viewed in FIG. 3.

In the second embodiment, the insulating protective tape 8 which covers the back of the conductive adhesive material 7 described above in connection with the first embodiment is made the same in size as the conductive adhesive material 7 in planar directions (in the direction along the longer sides and in the direction the shorter sides). Specifically, as shown in FIGS. 3 to 4C, the insulating protective tape 8 lies to cover only the back of the conductive adhesive material 7 with the conductive coat 2 of the panel 1 and the reinforcing band 4 which serves as a grounding member being bridged similarly to those in the first embodiment. The advantage of the second embodiment is nearly the same as that of the first embodiment, but in the second embodiment, the adhesive strength of the grounding electrode 6 to the conductive coat 2 or the reinforcing band 4 which serves as a grounding member is small compared to the first embodiment. However, in the case where the area of the grounding electrode 6 is large or the thickness thereof is relatively small with respect to the area, the required object can be fully achieved even with this construction. The other construction is similar to that of the first embodiment.

Figure 5:
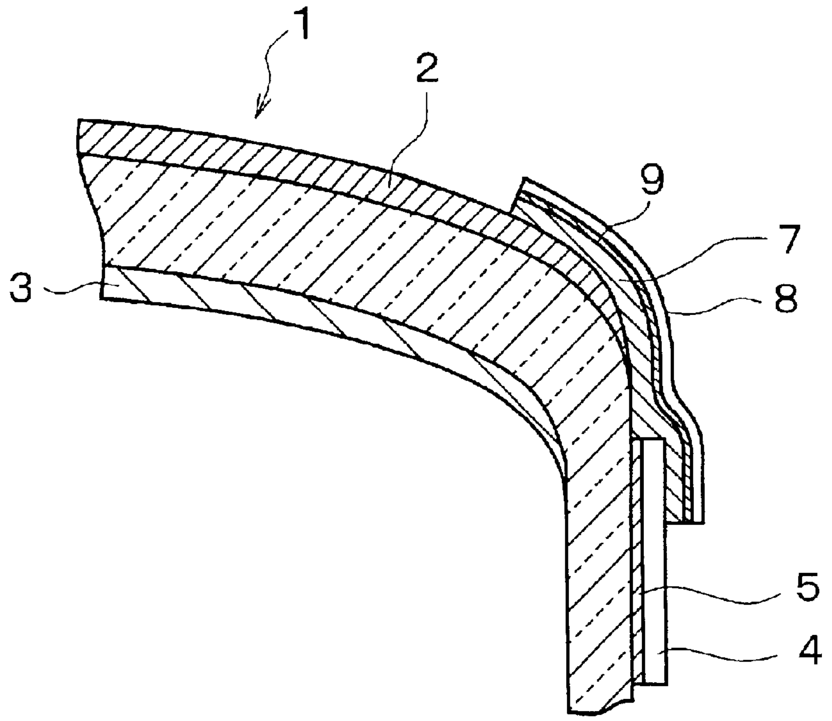
FIG. 5 is a cross-sectional view schematically illustrating the essential structure of a third embodiment of a color cathode ray tube according to the invention.
Figure 6:
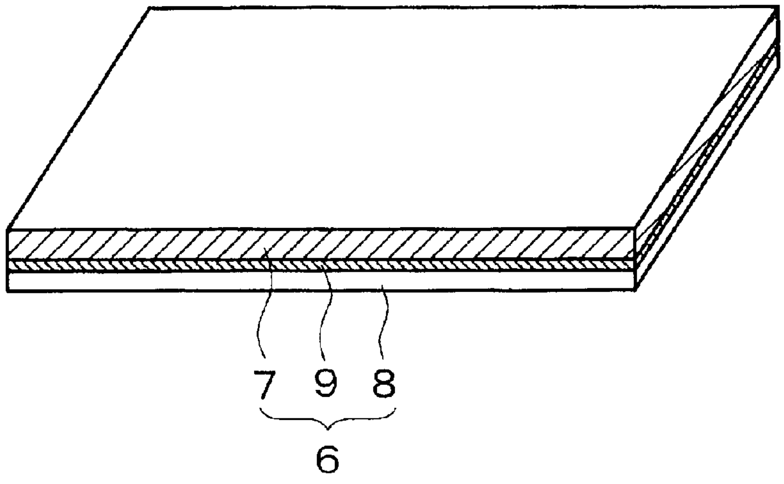
FIG. 6 is a perspective view of the grounding electrode shown in FIG. 5.
Figure 7:
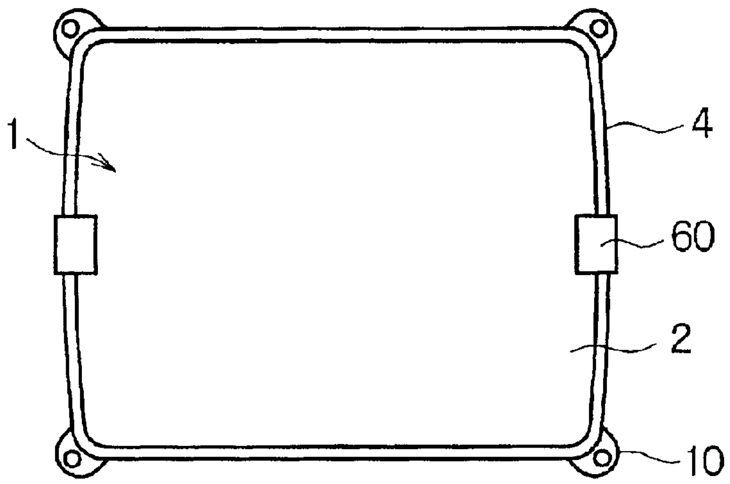
FIG. 7 is a schematic view of the front of a panel portion of a color cathode ray tube, aiding in explaining the essential construction of the color cathode ray tube whose panel has a surface coated with a conductive coat.
Figure 8:
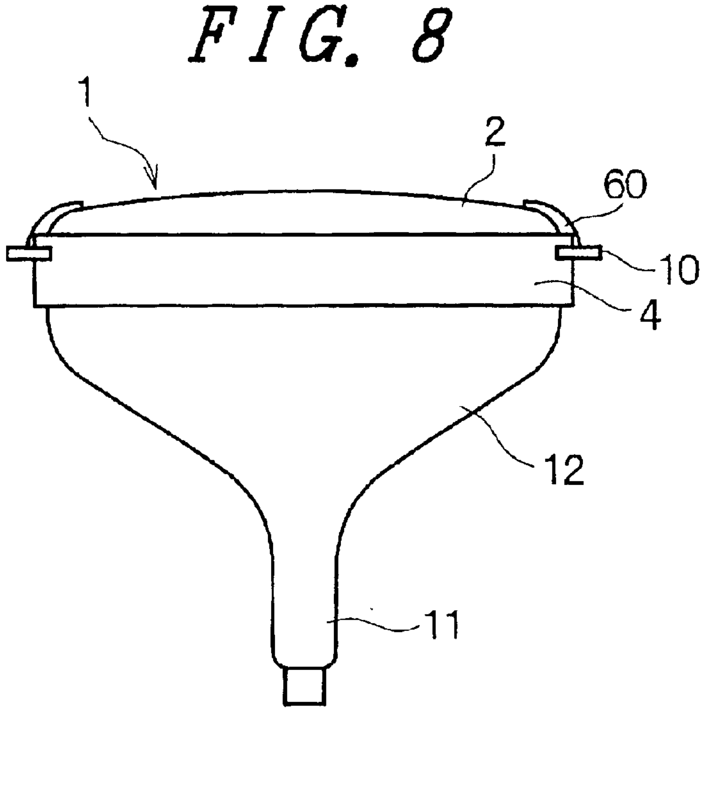
FIG. 8 is a schematic side view of the entire color cathode ray tube shown in FIG. 7.

FIG. 5 is a cross-sectional view schematically illustrating the essential structure of a third embodiment of a color cathode ray tube according to the invention. FIG. 6 is a perspective view of the grounding electrode 6 shown in FIG.

5. In FIGS. 5 and 6, the same reference numerals as those used in FIGS. 1 to 4C correspond to the same functions portions shown in FIGS. 1 to 4C.

In the third embodiment, the grounding electrode 6 further includes a metal thin film 9 inserted between the insulating protective tape 8 and the conductive adhesive material 7 that are provided in the second embodiment. This metal thin film 9 is obtained by coating a resin film such as a PET film which constitutes the insulating protective tape 8 with an electrical good conductor such as aluminum, copper, chromium or silver by a vacuum evaporation process or a sputtering method.

The conductive adhesive material 7 is adhered to and stacked on the insulating protective tape 8 coated with the metal thin film 9, and is formed as the grounding electrode 6 which is integrally made of three layers.

The metal thin film 9 functions as an auxiliary conductive layer and assists in the electrical connectivity of the conductive adhesive material 7 to serve a far more reliable grounding effect, and can inhibit the radiation of unwanted radiation electric fields to a further extent. The other advantages of the third embodiment are similar to those of each of the above-described embodiments.

Experimental color cathode ray tubes to which the respective embodiments were applied were prepared and tests were performed with the experimental tubes. The results of the tests will be described below.

Experimental Example 1

The panel and the reinforcing band of a color cathode ray tube having a panel surface on which a known low-reflection antistatic layer (conductive coat) was formed by a sol-gel process were electrically connected together by using the panel grounding electrode of the first embodiment described previously with reference to FIG. 1. A driver circuit was mounted to this color cathode ray tube, and an ON-OFF test of its power source was performed.

In the result, even after the power source was switched on and off 50,000 times repeatedly, the destruction of the By low-reflection antistatic layer due to discharge did not occur.

In addition, as to the inhibition of unwanted radiation electric fields, it was confirmed that Experimental Example 1 had an improved electric field inhibiting capability compared to the related-art direct grounding method using metal tape and the electric field inhibiting capability was improved several tens of percent compared to the related art.

Experimental Example 2

The panel and the reinforcing band of a color cathode ray tube having a panel surface on which a known multi-layer type of low-reflection antistatic layer (conductive coat) was formed by a sputtering method were electrically connected together by using the panel grounding electrode of the second embodiment described previously with reference to FIGS. 2A to 2C. A driver circuit was mounted to this color cathode ray tube, and an ON-OFF test of its power source was performed.

In the result, even after the power source was switched on and off 100,000 times repeatedly, the destruction of the low-reflection antistatic layer due to discharge did not occur.

In addition, as to the inhibition of unwanted radiation electric fields, it was confirmed that Experimental Example 2 had an improved electric field inhibiting capability compared to the related-art direct grounding method using metal tape.

Experimental Example 3

A color cathode ray tube having a low-reflection antistatic layer (conductive coat) similar to that of Experimental Example 1 was used with a penal grounding electrode having a construction according to the third embodiment described previously with reference to FIGS. 5 and 6. In this construction, the panel and the reinforcing band were connected together with the conductive adhesive material being made extremely small in area, and a discharge test was performed with the destruction of the low-reflection antistatic layer which was a surface-treatment film being easily caused.

In this test, when a discharge occurs from an edge portion of the panel grounding electrode toward the panel surface and the destruction of the low-reflection antistatic layer occurs, the density of current flowing in the metal thin film 9 formed to overlie the conductive adhesive material 7 of the panel grounding electrode 6 shown in FIG. 6 locally increases. It has been confirmed that the following phenomenon occurs: owing to the fact that the local portions of the metal thin film 9 are melted by such current, the grounding electrode 6 is self-restored to a shape which does not easily cause a concentration of electric fields.

This phenomenon means that even if the destruction of the conductive coat occurs in the vicinity of the panel grounding electrode for any reason, the self-restoration of the relevant discharged portion is effected. Accordingly, it can be understood that the phenomenon provides a basis for the fact that the panel grounding electrode according to the invention has an extremely high reliability. Each of the embodiments has been described in connection with a structure for connecting a conductive coat (low-reflection antistatic layer) formed on a panel of a color cathode ray tube to a reinforcing band, but the invention is not limited to this structure. As described previously, the invention can be similarly applied to a liquid crystal panel, a plasma panel, an EL panel or any other display in which a conductive coat similar to any of the above-described ones is formed on its display area.

As is apparent from the foregoing description, according to a representative construction of the invention, a grounding electrode which adhesively connects various kinds of conductive coats formed on a display area to a grounding member is of the type that uses conductivity based on the $\pi$ electron theory of ensuring electrical conduction in the whole of an adhesive layer, whereby the area of contact of the grounding electrode to the conductive coat can be made large. Accordingly, the destruction of the conductive coat due to discharge is prevented and stable grounding connection is maintained for a long time. In addition, the work efficiency of assembling work is similar to that for the related-art metal tape, and no special work is needed.

Furthermore, because a bond having a capacitive component is provided with respect to the contact between the conductive coat and the grounding member, minute alternating potentials appearing in the display area, can be fully absorbed, and unwanted radiation electric fields can be inhibited or reduced highly efficiently.

What is claimed is:

1. An image display device comprising:

a grounding member disposed outside a display area of a panel having a surface coated with a conductive coat; and a panel grounding electrode for electrically connecting the conductive coat to the grounding member in a peripheral portion of the display area;

the panel grounding electrode comprising an insulating protective tape, a conductive adhesive material and a metal thin film, which has an insulating surface and a conductive surface, the conductive adhesive material is stacked on the metal thin film, and adhered to the panel and the grounding member.

2. An image display device according to claim 1, wherein the conductive adhesive material is adhered to the panel, and the panel grounding electrode has the metal thin film on a surface of the conductive adhesive material on an opposite side to a panel-side adhesive surface thereof.

3. An image display device according to claim 2, wherein the panel grounding electrode has an insulating protective tape on a surface of the metal thin film on an opposite side to the conductive adhesive material.

4. An image display device according to claim 1, wherein the metal thin film is coated by a vacuum evaporation method or a sputtering method on the insulating protective tape.

* * * * *